United States Patent
Du et al.

(10) Patent No.: US 8,891,293 B2
(45) Date of Patent: Nov. 18, 2014

(54) HIGH-ENDURANCE PHASE CHANGE MEMORY DEVICES AND METHODS FOR OPERATING THE SAME

(75) Inventors: Pei-Ying Du, Taipei (TW); Chao-I Wu, Hsinchu (TW); Ming-Hsiu Lee, Hsinchu (TW); Sangbum Kim, Stamford, CT (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 414 days.

(21) Appl. No.: 13/472,395

(22) Filed: May 15, 2012

(65) Prior Publication Data

US 2012/0327708 A1 Dec. 27, 2012

Related U.S. Application Data

(60) Provisional application No. 61/500,567, filed on Jun. 23, 2011.

(51) Int. Cl.
*G11C 11/00* (2006.01)
*G11C 13/00* (2006.01)

(52) U.S. Cl.
CPC ........ *G11C 13/0004* (2013.01); *G11C 13/0021* (2013.01)
USPC .......................................... 365/163; 365/148

(58) Field of Classification Search
CPC ..................................................... G11C 11/00
USPC ............. 365/46, 94, 100, 113, 129, 148, 158, 365/163; 257/2–5, 9, 296, 310, 379, 467, 257/E21.35, E31.047, E27.006; 438/29, 95, 438/96, 166, 135, 240, 259, 365, 382, 482, 438/486, 597; 977/754
See application file for complete search history.

(56) References Cited

U.S. PATENT DOCUMENTS

| | | |
|---|---|---|
| 3,922,648 A | 11/1975 | Buckley |
| 4,225,946 A | 9/1980 | Neale et al. |
| 4,228,524 A | 10/1980 | Neale et al. |
| 5,341,328 A | 8/1994 | Ovshinsky et al. |

(Continued)

OTHER PUBLICATIONS

Lee S, et al., "A Novel Programming Method to Refresh a Longcycled Phase Change Memory Cell," Joint Non-Volatile Semiconductor Memory Workshop, and International Conference on Memory Technology and Design, NVSMW/ICMTD, May 2008, pp. 46-48.

*Primary Examiner* — Harry W Byrne
(74) *Attorney, Agent, or Firm* — Haynes Beffel & Wolfeld LLP

(57) ABSTRACT

Phase change based memory devices and methods for operating such devices described herein overcome the set or reset failure mode and result in improved endurance, reliability and data storage performance. A high current repair operation is carried out in response to a set or reset failure of a phase change memory cell. The higher current repair operation can provide a sufficient amount of energy to reverse compositional changes in the phase change material which can occur after repeated set and reset operations. By reversing these compositional changes, the techniques described herein can recover a memory cell which experienced a set or reset failure, thereby extending the endurance of the memory cell. In doing so, phase change based memory devices and methods for operating such devices are provided which have high cycle endurance.

22 Claims, 6 Drawing Sheets

(56) References Cited

U.S. PATENT DOCUMENTS

| | | |
|---|---|---|
| 6,762,952 B2 | 7/2004 | Munden et al. |
| 6,768,665 B2 | 7/2004 | Parkinson et al. |
| 6,781,906 B2 | 8/2004 | Perner et al. |
| 6,927,411 B2 | 8/2005 | Kozicki |
| 7,085,154 B2 | 8/2006 | Cho et al. |
| 7,190,607 B2 | 3/2007 | Cho et al. |
| 7,289,351 B1 | 10/2007 | Chen et al. |
| 7,365,355 B2 | 4/2008 | Parkinson |
| 7,505,330 B2 | 3/2009 | Pawlowski et al. |
| 7,539,050 B2 | 5/2009 | Philipp et al. |
| 7,558,105 B2 | 7/2009 | Suh |
| 7,571,901 B2 | 8/2009 | Philipp |
| 7,577,024 B2 | 8/2009 | Fackenthal et al. |
| 7,580,277 B2 | 8/2009 | Fuji |
| 7,656,701 B2 | 2/2010 | Lee et al. |
| 7,679,954 B2 | 3/2010 | Lee et al. |
| 7,751,227 B2 | 7/2010 | Fuji |
| 7,764,533 B2 | 7/2010 | Breitwisch et al. |
| 7,767,993 B2 | 8/2010 | Toda et al. |
| 7,796,424 B2 | 9/2010 | Happ et al. |
| 7,826,248 B2 | 11/2010 | Xi et al. |
| 7,830,701 B2 | 11/2010 | Siau et al. |
| 7,863,594 B2 | 1/2011 | Akinaga et al. |
| 7,867,804 B2 | 1/2011 | Lee |
| 7,869,270 B2 | 1/2011 | Lee |
| 2003/0002331 A1 | 1/2003 | Park et al. |
| 2005/0275433 A1 | 12/2005 | Lee |
| 2006/0034112 A1 | 2/2006 | Oh et al. |
| 2007/0140029 A1 | 6/2007 | Kim et al. |
| 2007/0236987 A1* | 10/2007 | Cho et al. ............... 365/163 |
| 2008/0019170 A1 | 1/2008 | Happ et al. |
| 2008/0025076 A1* | 1/2008 | Scheuerlein et al. ........ 365/163 |
| 2008/0025077 A1* | 1/2008 | Scheuerlein et al. ........ 365/163 |
| 2008/0025078 A1* | 1/2008 | Scheuerlein et al. ........ 365/163 |
| 2008/0048167 A1 | 2/2008 | Kostylev et al. |
| 2009/0008636 A1 | 1/2009 | Lee |
| 2009/0161421 A1* | 6/2009 | Cho et al. ............... 365/163 |
| 2009/0168504 A1 | 7/2009 | Lee et al. |
| 2009/0250678 A1 | 10/2009 | Osano et al. |
| 2009/0273968 A1 | 11/2009 | Lamorey et al. |
| 2009/0279349 A1* | 11/2009 | Shih et al. ............... 365/163 |
| 2009/0279350 A1* | 11/2009 | Chen et al. ............... 365/163 |
| 2010/0008133 A1* | 1/2010 | Cho et al. ............... 365/163 |
| 2010/0038614 A1 | 2/2010 | Hampton |
| 2010/0165711 A1* | 7/2010 | Lee ............... 365/163 |
| 2010/0177553 A1* | 7/2010 | Lee et al. ............... 365/148 |
| 2010/0214829 A1 | 8/2010 | Breitwisch et al. |
| 2010/0328995 A1 | 12/2010 | Shih et al. |
| 2011/0013446 A1 | 1/2011 | Lung |
| 2011/0116309 A1 | 5/2011 | Lung |

* cited by examiner

HIGH-ENDURANCE PHASE CHANGE MEMORY DEVICES AND METHODS FOR OPERATING THE SAME

CROSS-REFERENCE TO RELATED APPLICATIONS

The present application claims the benefit of U.S. Provisional Application No. 61/500,567, filed 23 Jun. 2011, entitled "High-Endurance Phase Change Memory Devices and Methods for Operating the Same," which is incorporated by reference herein.

BACKGROUND

1. Field of the Invention

The present invention relates to memory devices based on phase change materials including chalcogenide materials, and methods for operating such devices.

2. Description of Related Art

Phase change based memory materials, like chalcogenide based materials and similar materials, can be caused to change between an amorphous phase and a crystalline phase by application of electrical current at levels suitable for implementation in integrated circuits. The amorphous phase is characterized by higher electrical resistivity than the crystalline phase, which can be readily read to indicate data. These properties have generated interest in using programmable resistive material to form non-volatile memory circuits, which can be read and written with random access.

The change from the amorphous to the crystalline phase, referred to as a set operation herein, is generally a lower current operation. The change from crystalline to amorphous phase, referred to as a reset operation herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

After repeated set and reset operations, phase change memory cells can experience a 'stuck-set failure' or reset failure mode in which the reset operation can no longer sufficiently increase the resistance of the memory cell On the other hand, the memory cells can also experience a "stuck-high failure" or set failure mode in which the set operation cannot sufficiently reduce the resistance of the memory cell. These failure modes limit the cycle endurance of the device.

It is therefore desirable to provide phase change based memory devices and methods for operating which address the endurance issues associated with the stuck-set or stuck-high failure modes.

SUMMARY

Phase change based memory devices and methods for operating such devices described herein overcome the failure modes and result in improved endurance, reliability and data storage performance.

A high current repair operation is carried out in response to set or reset failure of a phase change memory cell. A set failure occurs when the resistance of the memory cell cannot be reduced to a resistance corresponding to the lower resistance set state in response to a set operation. A reset failure occurs when the resistance of the memory cell cannot be increased to a resistance corresponding to the higher resistance reset state in response to a reset operation. The repair operation induces a higher current magnitude through phase change memory cell than the normal reset operation, such that a larger volume of phase change material is melted during the repair operation than during the reset operation.

The higher current repair operation can provide a sufficient amount of energy to reverse compositional changes in the phase change material which can occur after repeated set and reset operations. These compositional changes can include set and reset operation induced electromigration and phase segregation in the phase change material which resulted in the set or reset failure.

By reversing these compositional changes, the techniques described herein can recover a memory cell which experienced a set or reset failure, thereby extending the endurance of the memory cell. In doing so, phase change based memory devices and methods for operating such devices are provided which have high cycle endurance.

In addition, the set operation, reset operation and the higher current repair operation are carried out by applying pulses which have the same voltage polarity across the phase change memory cell. In other words, the current through the phase change memory cell flows in the same direction during each operation. As a result, the complexity of control and bias circuitry needed to operate the memory cell is greatly simplified, as compared to that needed to apply opposite polarity pulses.

Other aspects and advantages of the present invention can be seen on review of the drawings, the detailed description, and the claims which follow.

DETAILED DESCRIPTION

A detailed description of embodiments of the present invention is provided with reference to the FIGS. 1-6.

Figure 1:
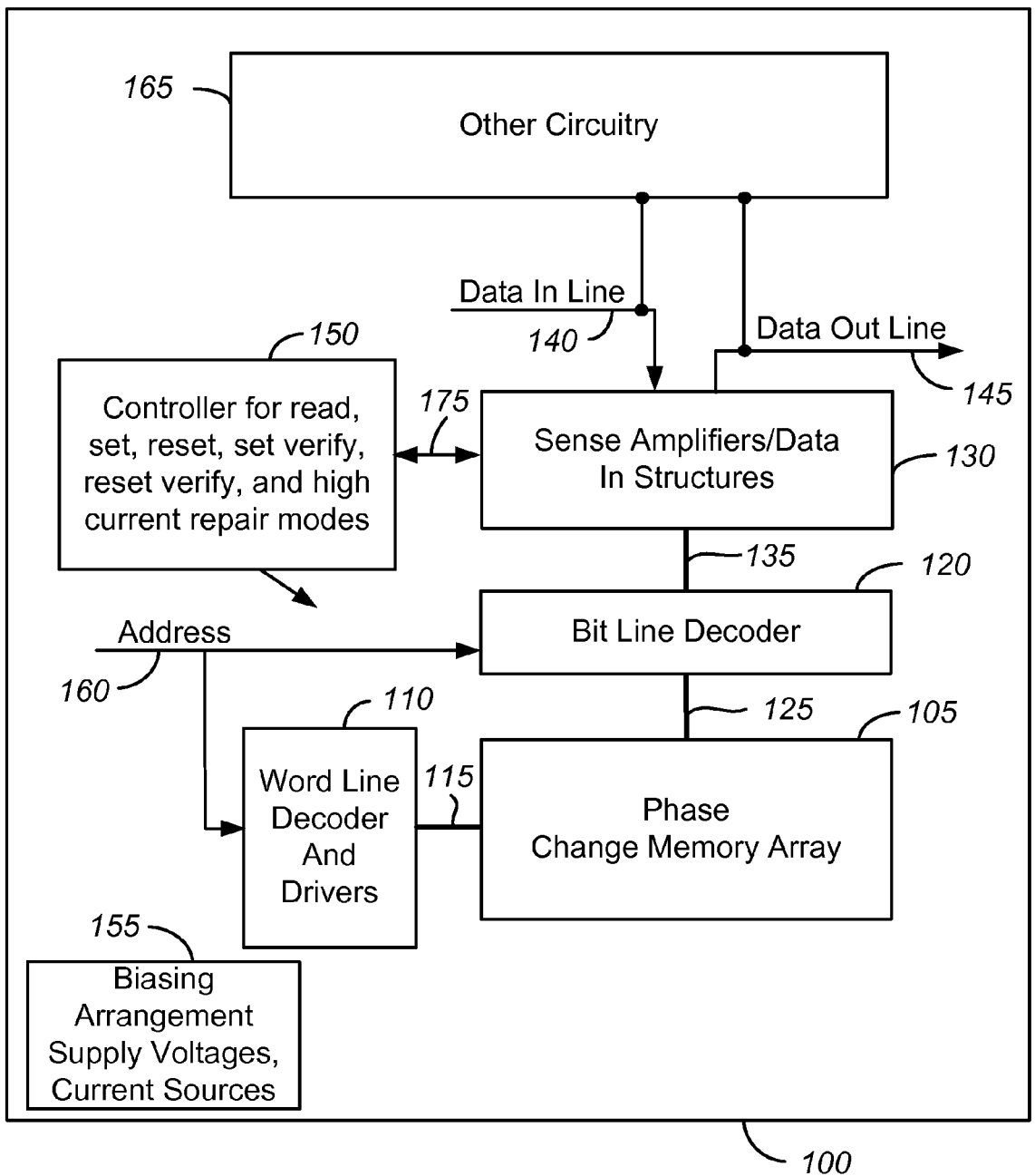
FIG. 1 is a simplified block diagram of an integrated circuit including a phase change memory cells which can be operated as described herein.

FIG. 1 is a simplified block diagram of an integrated circuit 100 including a phase change memory array 105 of phase change memory cells (not shown) which can be operated as described herein. A word line decoder and drivers 110 having read, set, reset, set verify, reset verify and high current repair modes is coupled to and in electrical communication with a plurality of word lines 115 arranged along rows in the phase change memory array 105. A bit line (column) decoder 120 is in electrical communication with a plurality of bit lines 125 arranged along columns in the array 105 for reading data from, and writing data to, the phase change memory cells in the array 105. Addresses are supplied on bus 160 to word line decoder and drivers 110 and bit line decoder 120. Sense circuitry (sense amplifiers) and data-in structures in block 130 are coupled to bit line decoder 120 via data bus 135. Data is supplied via a data-in line 140 from input/output ports on the integrated circuit 100, or from other data sources internal or external to the integrated circuit 100, to data-in structures in block 130. Other circuitry 165 may be included on the integrated circuit 100, such as a general purpose processor or special purpose application circuitry, or a combination of modules providing system-on-a-chip functionality supported by the phase change array 105. Data is supplied via a data-out line 145 from the sense amplifiers in block 130 to input/output ports on the integrated circuit 100, or to other data destinations internal or external to the integrated circuit 100.

The integrated circuit 100 includes a controller 150 for read, set, reset, set verify, reset verify and high current repair modes. The controller 150, implemented in this example using a bias arrangement state machine, controls the application of bias arrangement supply voltages and current sources 155 for the application of bias arrangements including read, set, reset, set verify, reset verify and high current repair modes. The controller 150 is coupled to the sense amplifiers in block 175 for controlling the biasing arrangement supply voltages and current sources 155 in response to output signals from the sense amplifiers in block 130. Controller 150 may be implemented using special-purpose logic circuitry as known in the art. In alternative embodiments, controller 150 comprises a general-purpose processor, which may be implemented on the same integrated circuit to execute a computer program to control the operations of the integrated circuit 100.

Figure 2:
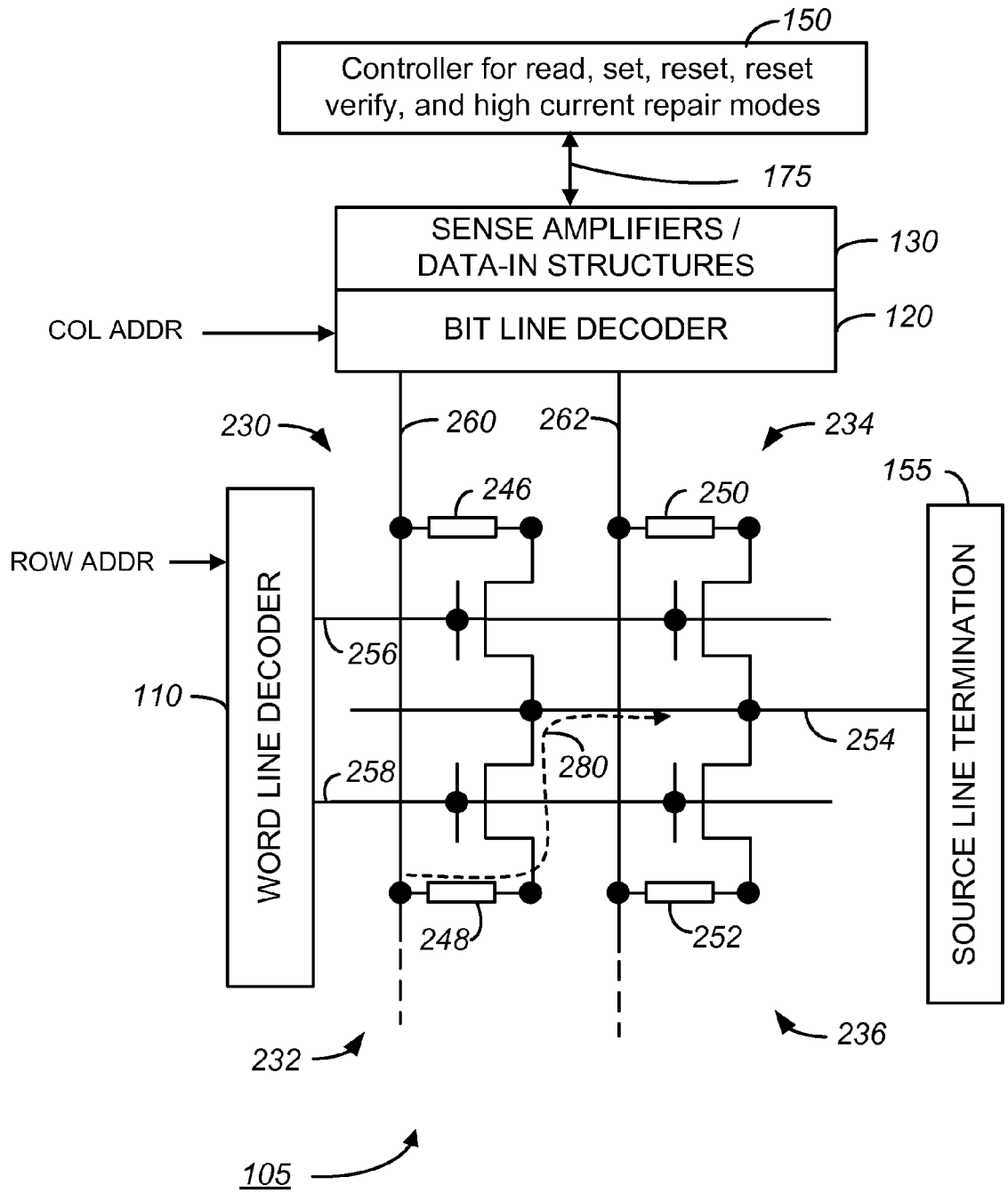
FIG. 2 illustrates an example of a portion of phase change memory cells in the phase change memory array of FIG. 1.

FIG. 2 illustrates an example of a portion of phase change memory cells in the phase change memory array 105 of FIG. 1. As shown in FIG. 2, each of the memory cells includes an access transistor or other access device such as a diode. Four memory cells 230, 232, 234, 236 having respective phase change memory elements 246, 248, 250, 252 are shown in FIG. 2, representing a small section of an array that include millions of memory cells. The memory cells are programmable to a plurality of resistance states including a high resistance state and a low resistance state. The resistance states correspond to non-overlapping ranges of resistance values for the corresponding phase change memory elements.

Sources of each of the access transistors of the memory cells 230, 232, 234, 236 are connected in common to a source line 254 that terminates in a source line termination circuit 155. In another embodiment, the sources of the access devices are not electrically connected, but independently controllable. The source line termination circuit 155 may for example be a ground terminal. Alternatively, in some embodiments the source line termination circuit 155 may include bias circuits such as voltage sources and current sources, and decoding circuits for applying bias arrangements, other than ground, to the source line 254.

A plurality of word lines including word lines 256, 258 extend in parallel along a first direction. The word lines 256, 258 are in electrical communication with word line decoder 110. The gates of access transistors of memory cells 230, 234 are connected to word line 256. The gates of access transistors of memory cells 232, 236 are connected to word line 258.

A plurality of bit lines including bit lines 260, 262 extend in parallel along a second direction. The bit lines 260, 262 are in electrical communication with bit line decoder 120. Memory elements 246, 248 couple the bit line 260 to the respective drains of the access transistors of memory cells 230, 232. Memory elements 250, 252 couple the bit line 262 to the respective drains of the access transistors of memory cells 234, 236.

It will be understood that the memory array 105 is not limited to the array configuration illustrated in FIG. 2, and other array configurations may be used. Additionally, instead of MOS transistors, bipolar transistors or diodes may be used as access devices in some embodiments.

In operation, each of the memory cells 230, 232, 234, 236 store a data value depending upon the resistance of their respective memory elements 246, 248, 250, 252. The data value may be determined, for example, by comparison of current on a bit line for a selected memory cell to that of a suitable reference current. In a memory cell programmable to three or more resistance states, a plurality of reference currents can be established so that different ranges of bit line currents corresponding to each of the three or more resistance states.

Reading or writing to a selected memory cell of the array 105 can be achieved by applying a suitable voltage to the corresponding word line and coupling the corresponding bit line to a bias voltage so that current flows through the selected memory cell including through the respective memory element. For example, a current path 280 through a selected memory cell 232 is established by applying bias voltages to the bit line 260, word line 258, and source line 254 sufficient to turn on the access transistor of the memory cell 232 and induce current in path 280 from the bit line 260 to the source line 254, or vice versa.

In a read (or sense) operation of memory cell 232, a bias voltage is applied across the selected memory cell to induce a current through the memory element. The current does not cause the memory element to undergo a change in resistive state. The magnitude of the current through the memory element is dependent upon the resistance of the memory element and thus the data value stored in the memory cell 232. Therefore, the current that is induced serves to read the memory cell as the magnitude of such current depends on what resistive state the memory element is in corresponding to a stored or lack thereof data value.

Figure 3:
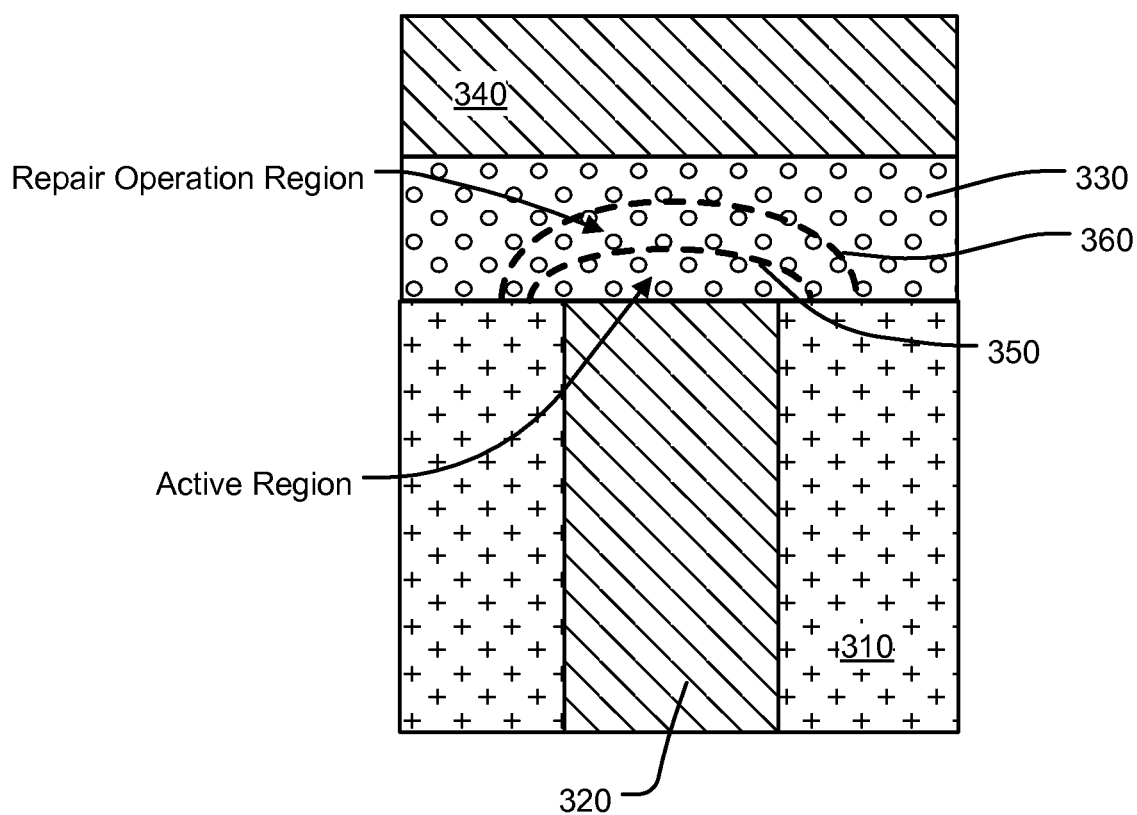
FIG. 3 illustrates a cross-sectional view of a mushroom-type memory cell having an active region and a larger volume repair region.

FIG. 3 is a cross sectional view of an example of a portion of a memory cell 300. The portion of the memory element 300 includes first and second electrodes 320 and 340. The first and second electrodes 320 and 340 are in electrical contact with a layer of a phase change memory material 330. In operation, voltages are applied to the first and second electrodes 320 and 340 to cause a current to pass through the layer of phase change memory material 330. Such current allows for the read/sense and write operation of the portion of the memory element 300 within the memory cell.

The memory material layer 330 includes an active region in which a majority of the phase change between crystalline and amorphous states occurs during set and reset operations. During reset operations, a voltage pulse is applied to the memory material layer 330 which induces the formation of a current that causes the phase change material within the active region that is in a low resistance crystalline state to transform to a high resistance amorphous state. During set operations, a voltage pulse is applied to the memory material layer 330 which induces the formation of a current that causes the phase change material within the active region that is in a high resistance amorphous state to transform to a low resistance crystalline state. Such differing resistance states correspond to the storage of data within the memory cell.

During the lifetime of a memory cell, the cell is cycled repeatedly between set and reset states. Over time, the repeated application causes electromigration and phase segregation within the active region. The electromigration is induced by the creation of an electric field within the memory material layer 330 during memory cell set and reset operations. On the other hand, the phase segregation is induced by the purification and the movement of atoms of the memory material 330 along the temperature gradient during memory cell operation. The electromigration and phase segregation can cause the formation of a high resistance interface 350 or region around the active region. Such high resistance interface 350 or region is within the conduction path between the first and second electrodes 320 and 340 such that the resistance of the cell within the memory material layer 330 becomes higher. As a result, after repeated cycles the cell fails through a mechanism called stuck high failure, whereby an applied low current pulse cannot pass through the cell to transform the active region from a high resistance amorphous reset state to a low resistance crystalline set state. Such stuck high failure mechanism occurs as the active region of the memory material layer 330 becomes stuck in the amorphous state.

The electromigration and phase segregation also can cause the formation of a low resistive region within the memory layer 330. Such low resistive region is formed within the conduction path between the first and second electrodes 320 and 340, such that the resistance of the cell within the memory material layer 330 becomes lower. As a result, of such lowered resistance, the applied high reset current is not high enough to generate enough heat within the memory material layer 330 to transform the cell from the low resistance set crystalline state to the high resistance amorphous state. Subsequently the device fails in a process that is known as stuck low failure as the active region of the memory material layer 330 becomes stuck in the crystalline state.

In order to stop both stuck high failure and stuck low failure mechanisms that result from electromigration and phase segregation after repeated cycles between the set and reset states, a healing or refresh pulse is applied to the cell. The healing pulse has the same voltage polarity across memory material layer 330 as the set and reset voltages that are applied across the memory material layer 330 during set and reset operations and induces a current in the same direction as the currents that are induced during both the set and reset operations. The healing pulse that has the same voltage polarity and induces a current that flows in the same direction across the memory material layer 330 as the set and reset operation bias voltages and the set and reset currents that are subsequently induced is advantageous in that it does not require the use of additional circuitry within the memory array to bias the memory cell with voltages of opposite polarities from the voltages that are applied during set and reset operations.

The healing pulse induces a current with a magnitude that is greater than the magnitude of the current that is induced through the high pulse that causes the transformation of the active region of the material layer 330 from the low resistance crystalline state to the high resistance amorphous state. The current magnitude of the healing pulse must be large enough, in combination with the duration of the pulse that is applied, to introduce enough energy to the phase change memory layer 330 to cause a portion of the phase change memory layer 330 to melt.

The healing pulse causes at least the active region and the repair operation region within the memory material layer 330 to melt. The repair operation region includes the region within the memory material layer 330 surrounding the active region in which atoms suffer from electromigration and phase segregation during repeated operations, thereby creating high resistance regions or low resistance regions within the conduction path of the memory material layer 330. The melting and subsequent solidifying of at least the active region and the repair operation region causes the atoms that migrated or segregated within the active region during electromigration and phase segregation to migrate back or rearrange within the active region such that the phase change memory material within the active region and the repair operation region is stabilized in an amorphous state with substantially the same stoichiometry throughout the phase change memory material within the active and repair operation regions. This in turn serves to effectively repair the damage that is caused during the operations and ensure that the defects that are high resistance and low resistance regions within the conductive path in both the active and repair operation regions are removed. As a majority of the defects of high and low resistive regions that are created during the operations occur within the active region and the repair operation region, causing both the active region and the repair operation to melt and subsequently solidify through the application of the healing pulse, ensures that a majority of the defects that are created during the operations are removed from the conduction path through the memory material layer 330. As a result, the endurance of the memory cell is extended and the cell can be cycled once again through set and reset operations without the risk of stuck high or stuck low failure.

Figure 4:
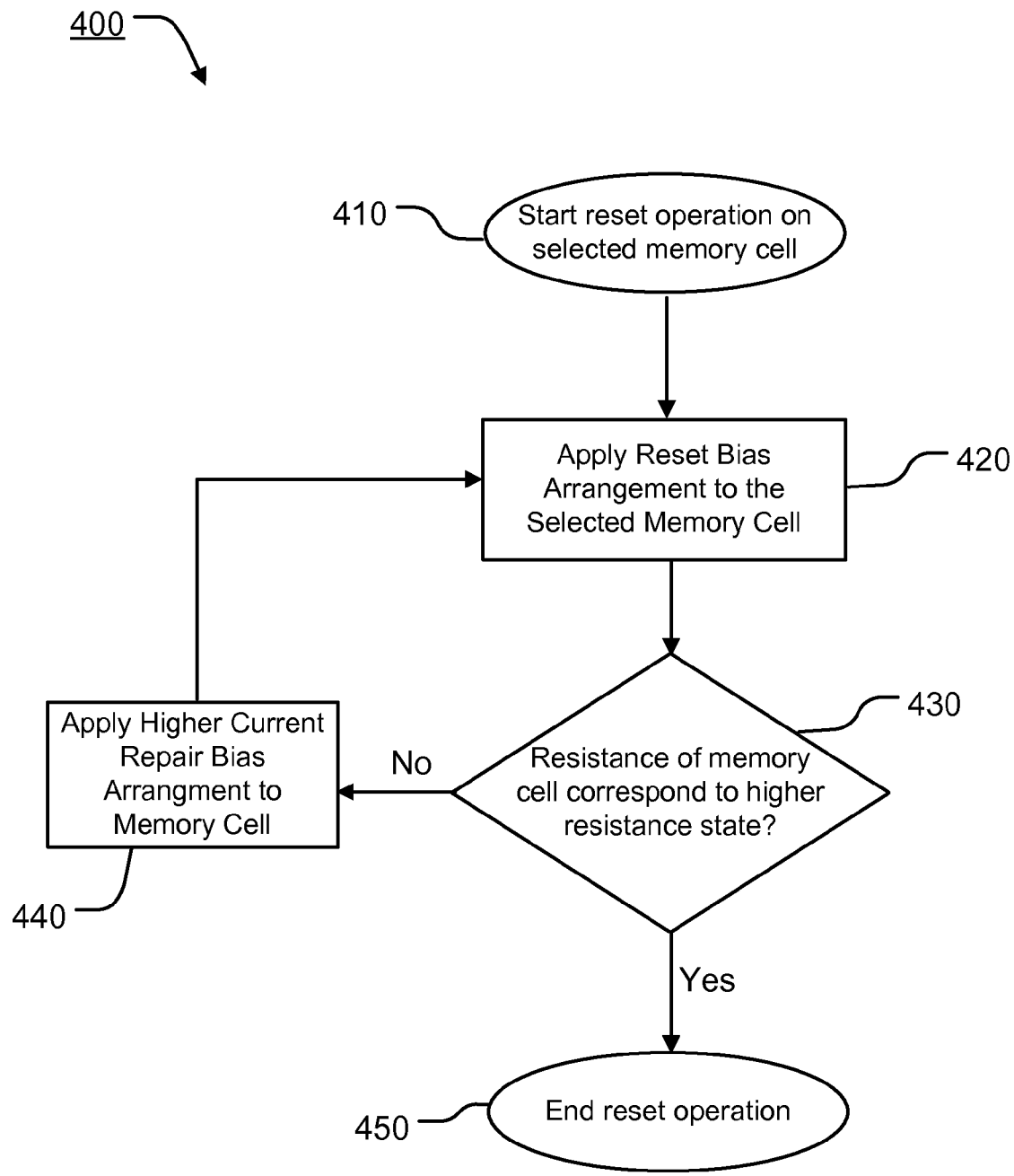
FIG. 4 is a flow diagram of a reset operation including a higher current repair mode as described herein.
Figure 5:
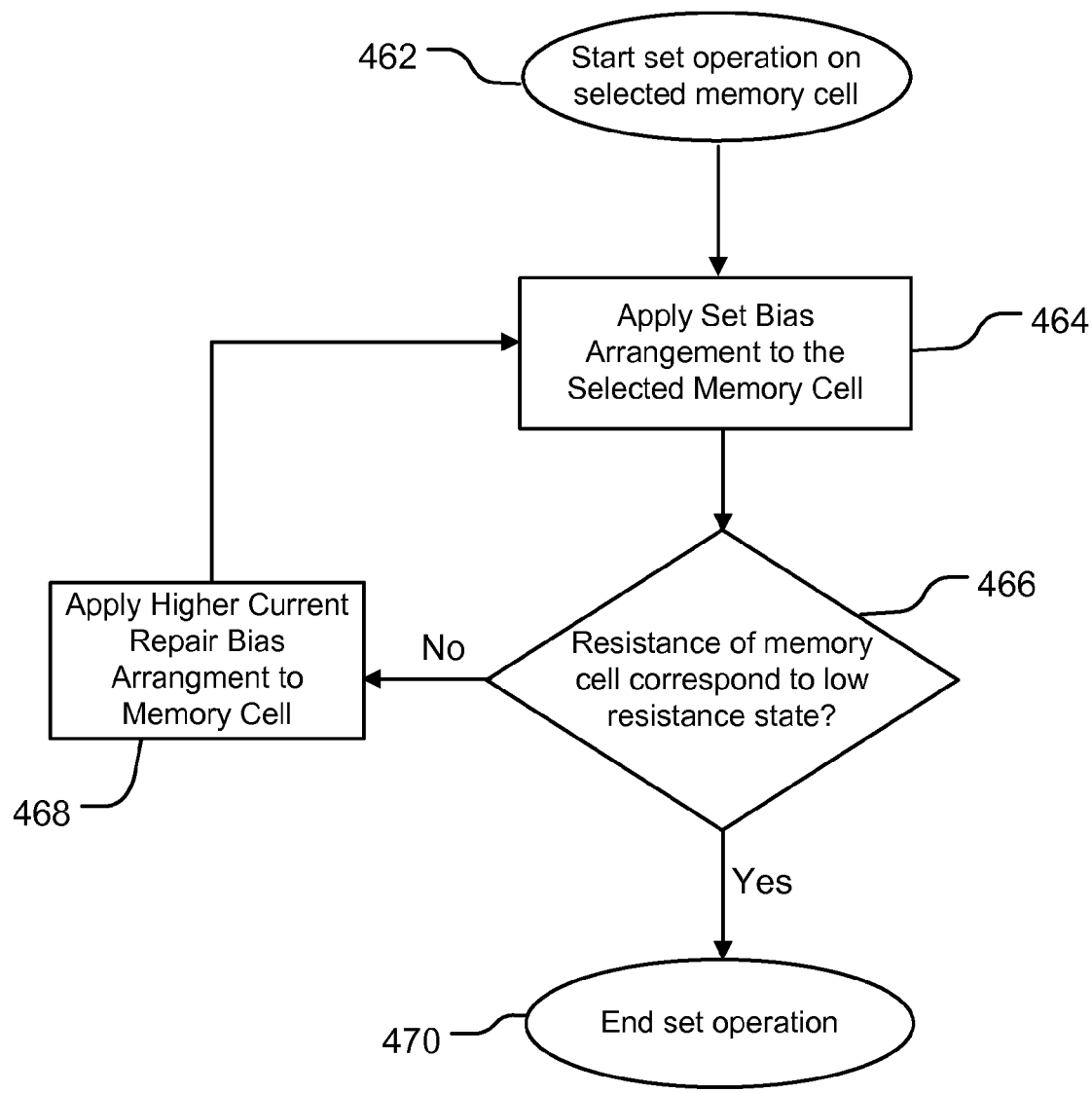
FIG. 5 is a flow diagram of a set operation including a higher current repair mode as described herein.

FIG. 4 is a flow diagram that illustrates an operational method of applying a healing/repair pulse during a reset operation. While FIG. 4 specifically describes applying the healing pulse during a reset operation in which the target resistance state for the memory cells is a reset, or higher resistance, state. The healing pulse can also be applied during a set operation in which the target resistance state for the memory cells is a set, or lower resistance, state as shown in FIG. 5. As shown in FIG. 4, first the reset operation is started in step 410. Then a reset bias is applied across the memory cell to induce the creation of a first reset current within the memory element of the memory cell in step 420. Such reset current causes the material within the active region of the memory cell to transform from a low resistance crystalline state to a high resistance amorphous state.

Next, in step 430, a read bias is placed across the memory cell to induce a read current through the memory cell. The method by which the current reads the memory cell is previously described. In this specific operational method, the read current senses whether or not the memory cell is in an amorphous high resistance state as a result of the reset bias that was applied previously in step 420. If the cell is in a high resistance reset state, the reset operation is ended, as is shown in step 450. However, if the cell is not in a high resistance state after application of a reset bias voltage, it is possible that either or both low resistance and high resistance region defects exists along the conduction path that prevent the cell from transforming into the higher resistance amorphous state in what is known as stuck low failure. As a result, as shown in step 440, a healing current is applied that through the previously described mechanisms, cures the low resistance and high resistance region defects that result from electromigration and phase segregation as a result of the application of repeated set and reset operations.

After the healing current is applied, step 440, the process loops back and a reset bias arrangement is once against applied across the memory cell in order to induce a reset current through the memory element of the memory cell, step 420. Once again a read bias is applied to sense whether or not the resistance of the memory cell corresponds to the high reset resistance state, step 430. If the resistance within the memory cell after application of the reset bias does correspond to the high resistance state the reset operation is ended, step 450. If the resistance within the memory cell does not correspond to the high resistance state, then once again a healing bias is applied to the cell, step 440, and the process loops back around again. This loop continues until a high resistance state within the cell is achieved that corresponds to the reset resistance state that is characteristic of a cell that is transformed into an amorphous reset state, or until a maximum retry limit is reached.

FIG. 5 is a flow diagram that illustrates an operational method of applying a healing/repair pulse during a set operation. As shown in FIG. 5, first the set operation is started in step 462. Then a set bias is applied across the memory cell to induce the creation of a set current within the memory element of the memory cell in step 464. Such set current causes the material within the active region of the memory cell to transform from a high resistance amorphous state to a low resistance crystalline state.

Next, in step 466, a read bias is placed across the memory cell to induce a read current through the memory cell. The method by which the current reads the memory cell is previously described. In this specific operational method, the read current senses whether or not the memory cell is in a crystalline low resistance state as a result of the set bias that was applied previously in step 464. If the cell is in a low resistance set state, the set operation is ended, as is shown in step 470. However, if the cell is not in a low resistance state after application of a set bias voltage, it is possible that either or both low resistance and high resistance region defects exists along the conduction path that prevent the cell from transforming into the low resistance crystalline state in what is known as stuck high failure. As a result, as shown in step 468, a healing current is applied that through the previously described mechanisms, cures the low resistance and high resistance region defects that result from electromigration and phase segregation as a result of the application of repeated set and reset operations.

After the healing current is applied, step 468, the process loops back and a set bias arrangement is once against applied across the memory cell in order to induce a set current through the memory element of the memory cell, step 464. Once again a read bias is applied to sense whether or not the resistance of the memory cell corresponds to the low resistance state, step 466. If the resistance within the memory cell after application of the set bias does correspond to the low resistance state the set operation is ended, step 470. If the resistance within the memory cell does not correspond to the low resistance state, then once again a healing bias is applied to the cell, step 468, and the process loops back around again. This loop continues until a low resistance state within the cell is achieved that corresponds to the set resistance state that is characteristic of a cell that is transformed into a crystalline set state, or until a maximum retry limit is reached.

Figure 6:
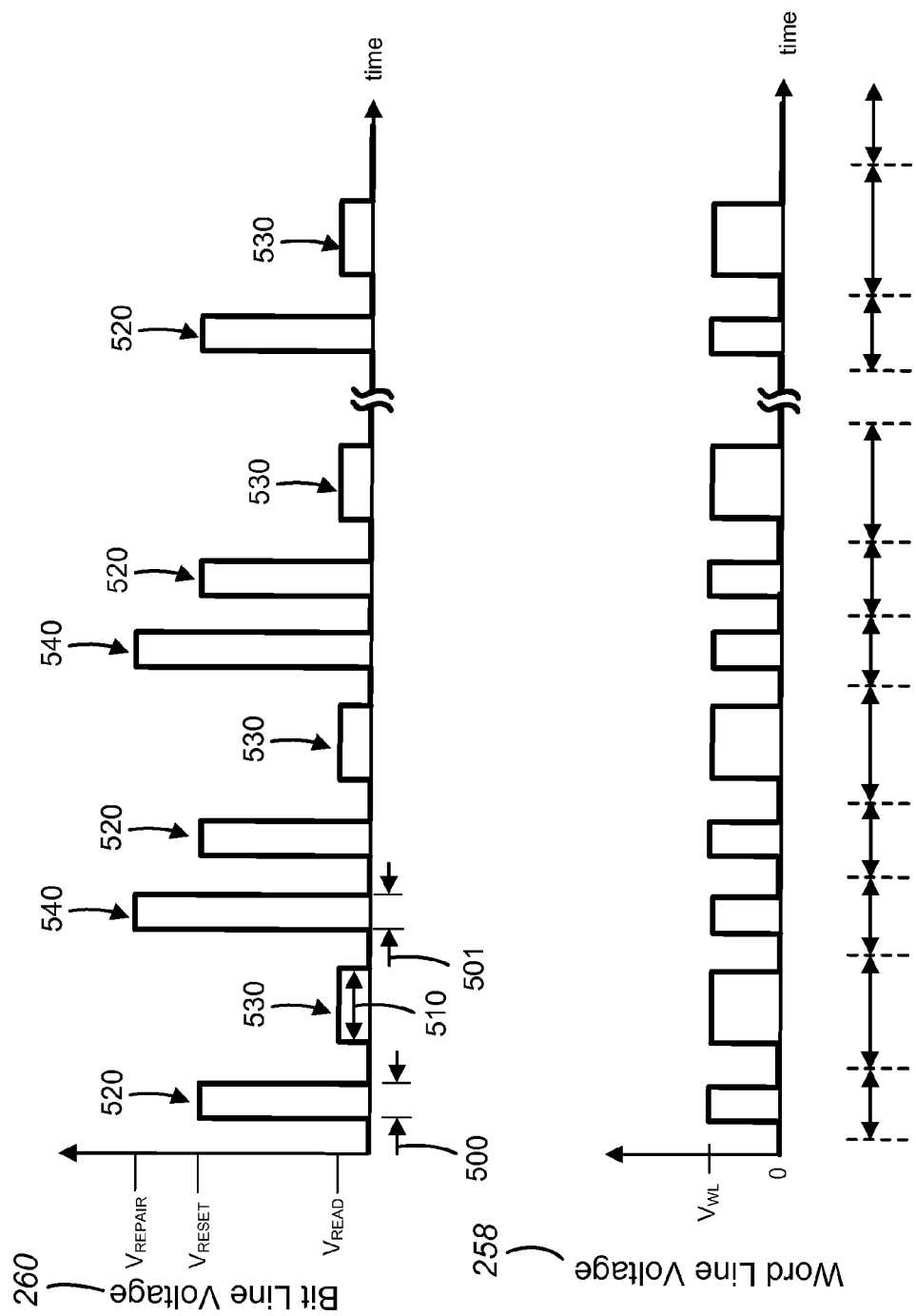
FIG. 6 is an example timing diagram of the reset operation of FIG. 4.

FIG. 6 is a graph of the voltages that are applied to the bit and word lines as a function of time for the operational method described in FIG. 4. Throughout the following bias arrangements a voltage a word line bias voltage is applied to the word line to turn on the access device, at any time when a bias voltage is created across the device. With respect to the bias voltage applied to the bit line, first, corresponding to step 420, a reset bias voltage 520 is applied to the word line. The reset bias voltage is applied to the word line for a duration 500 that is typically applied in a standard reset operation. The magnitude of the reset bias voltage 520 that is applied to the word line is greater than the magnitude of the read bias voltage 530 that is applied during read or sensing operations but can be less than the magnitude of the repair or healing voltage 540 that is applied to the word line during a healing operation. The reset voltage 520 is of a large enough magnitude that it causes the crystalline phase change memory material within the active region to transform to the amorphous reset state. However, the magnitude of the reset voltage 520 is not so large as to introduce enough energy into the memory material layer to cause the phase change memory material to melt in both the active region and the repair regions outside the active region within the memory material layer.

Next a read bias voltage 530 is applied that corresponds to step 420 of FIG. 4. The read bias voltage 530 is of a small enough magnitude to sense whether or not the cell is in the high resistance reset state through the mechanism as previously described, however, is of a small enough magnitude such that it does not cause the active region of the memory layer to transform to another resistance state. The read bias voltage 530 is applied to the bit line for a duration 510 that is long enough to accurately sense what the resistive state of the memory element of the memory cell is.

The graph of the voltage as a function of time shown in FIG. 6 represents the voltages that are applied when the read current senses that the resistive state of the memory element of the memory cell does not correspond to the high resistance state after the loop of the operational method shown in FIG. 4 is executed. As previously discussed and as is shown in FIG. 5, the healing pulse can also be applied during a set operation. After application of the read or sensing voltage pulse 530, since the memory element of the memory cell is not in the high resistance state, a repair or healing voltage pulse 540 is applied to the bit line that corresponds to step 440 in FIG. 4. The healing voltage pulse 540 is applied for a long enough duration 501 and has a magnitude that is great enough to cause the phase change memory material within the active region and the repair region of the memory material layer to melt. As shown in FIG. 6, the healing voltage pulse can be applied for a duration that is equal to the duration in which the reset voltage pulse 520 is applied. The healing voltage pulse 540 is then removed from the bit line and the melted material within the active and repair regions solidifies as the material quickly cools and is effectively quenched. As previously described such melting and solidification removes the high and low resistance region defects within the conductive path by causing atoms that have migrated within the active and repair regions to move into positions such that a stable amorphous state with a roughly uniform stoichiometry is achieved.

After application of the healing bias voltage pulse 540, the loop starts all over again and reset voltage pulse 520 is again applied to the bit line corresponding once again to step 420. In an embodiment in which a set failure is being repaired, then the pulse 520 is replaced with a set pulse, having a lower magnitude and slower falling edge than the reset pulse 520. The healing bias voltage pulse 540 can be of a duration that is shorter than the duration of the set pulse which is applied to achieve a set resistive state. Then a read voltage pulse 530 is again applied to determine whether or not the memory element of the memory cell is in a high resistive state that corresponds to the amorphous reset state. The application of the read voltage pulse 530 again corresponds to step 430 in which the resistive state of the cell is sensed. Then if the memory element of the memory cell is not in a high resistance states, a healing voltage pulse 540 is applied to the bit line in order to remove the defects, corresponding once again to step 440. The loop is then executed again and continuously until the defects are removed and the memory cell is not in a stuck-in failure mode and a subsequent high resistance state is achieved within the memory element of the memory cell. As illustrated the duration and magnitude of the healing pulse 540 are constant in each iteration. In some embodiments, one or both of the duration and magnitude can be increased in successive cycles, so that the amount of power available to generate heat in the memory element changes from each iteration.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell comprising phase change material and programmable to a plurality of resistance states including a higher resistance state and a lower resistance state, the method comprising:
applying a first bias arrangement to the memory cell to establish a target resistance state, the first bias arrangement comprising a first pulse to induce a first current through the phase change material;
determining that the memory cell is not in the target resistance state after applying the first bias arrangement;
in response to the determination, applying a second bias arrangement to the memory cell, the second bias arrangement comprising a second pulse to induce a second current through the phase change material, wherein the first pulse and the second pulse have the same voltage polarity across the phase change material, and the second pulse has a current magnitude greater than that of the first pulse; and
after applying the second bias arrangement, applying a subsequent bias arrangement to the memory cell to establish the target resistance state.

2. The method of claim 1, wherein the first current is sufficient to melt a first volume of phase change material, and the second current is sufficient to melt a second volume of phase change material that is greater than the first volume.

3. The method of claim 1, wherein the target resistance state is a reset state.

4. The method of claim 1, wherein the target resistance state is a set state.

5. The method of claim 1, further comprising applying a third bias arrangement to establish a resistance state that is different from the target resistance state, and wherein:
the third bias arrangement induces segregation of one or more elements of the phase change material in the active region of the memory cell; and
the second bias arrangement induces integration of at least a portion of the segregated elements in the active region.

6. The method of claim 1, wherein the first current is sufficient to cause a temperature in an active region of the phase change material that is greater than a melting temperature of the phase change material for a first duration, and the second current is sufficient to cause a temperature in the active region that is greater than the melting temperature for a second duration, the second duration greater than or equal to the first duration.

7. The method of claim 1, wherein the first current is sufficient to cause a temperature in an active region of the phase change material that is greater than a crystallization temperature of the phase change material and less than a melting temperature of the phase change material for a first duration, and the second current is sufficient to cause a temperature in the active region that is greater than the melting temperature of the phase change material for a second duration, the second duration less than the first duration.

8. The method of claim 1, further comprising limiting the second current to a predetermined maximum current magnitude.

9. The method of claim 1, wherein the subsequent bias arrangement is the first bias arrangement.

10. The method of claim 1, further comprising:
determining that the memory cell is not in the target resistance state after applying the subsequent bias arrangement;
iteratively applying an additional bias arrangement to the memory cell and determining that the memory cell is not in the target resistance state after applying the additional bias arrangement, until the memory cell is in the target resistance state or a predetermined number of additional bias arrangements have been applied.

11. The method of claim 10, wherein the additional bias arrangement is the first bias arrangement.

12. A memory device comprising:
a memory cell comprising phase change material and programmable to a plurality of resistance states including a high resistance state and a low resistance state; and
a controller to apply bias arrangements to the memory cell, the bias arrangements including:
a first bias arrangement to establish the target resistance state, the first bias arrangement comprising a first pulse to induce a first current through the phase change material;
a read bias arrangement to determine whether the memory cell is in the target resistance state after applying the first bias arrangement;
a second bias arrangement to apply if the memory cell is not in the target resistance state after applying the first bias arrangement, the second bias arrangement comprising a second pulse to induce a second current through the phase change material, wherein the first pulse and the second pulse have the same voltage polarity across the phase change material, and the second pulse has a magnitude greater than that of the first pulse; and
a subsequent bias arrangement to establish the target resistance state after applying the second bias arrangement.

13. A memory device of claim 12, wherein the first current is sufficient to melt a first volume of phase change material, and the second current is sufficient to melt a second volume of phase change material that is greater than the first volume.

14. The memory device of claim 12, wherein the target resistance state is a reset state.

15. The memory device of claim 12, wherein the target resistance state is a set state.

16. The memory device of claim 12, wherein the bias arrangements further include a third bias arrangement to a resistance state that is different from the target resistance state, and wherein:
the third bias arrangement induces segregation of one or more elements of the phase change material in the an active region of the memory cell; and
the second bias arrangement induces integration of at least a portion of the segregated elements in the active region.

17. The memory device of claim 12, wherein the first current is sufficient to cause a temperature in an active region of the phase change material that is greater than a melting temperature of the phase change material for a first duration, and the second current is sufficient to cause a temperature in the active region that is greater than the melting temperature for a second duration, the second duration greater than or equal to the first duration.

18. The memory device of claim 12, wherein the first current is sufficient to cause a temperature in an active region of the phase change material that is greater than a crystallization temperature of the phase change material and less than a melting temperature of the phase change material for a first duration, and the second current is sufficient to cause a temperature in the active region that is greater than the melting temperature of the phase change material for a second duration, the second duration greater less than the first duration.

19. The memory device of claim 12, further comprising current limiting circuitry to limit the second current to a predetermined current maximum magnitude.

20. The memory device of claim 12, wherein the subsequent bias arrangement is the first bias arrangement.

21. The memory device of claim 12, wherein the controller further includes logic to:
   apply the read bias arrangement to determine whether the memory cell is in the target resistance state after applying the subsequent bias arrangement; and
   if the memory cell is not in the target resistance state after applying the subsequent bias arrangement, iteratively applying an additional bias arrangement to the memory cell and determining that the memory cell is not in the target resistance state after applying the additional bias arrangement, until the memory cell is in the target resistance state or a predetermined number of additional bias arrangements have been applied.

22. The memory device of claim 21, wherein the additional bias arrangement is the first bias arrangement.

* * * * *

UNITED STATES PATENT AND TRADEMARK OFFICE
CERTIFICATE OF CORRECTION

PATENT NO. : 8,891,293 B2
APPLICATION NO. : 13/472395
DATED : November 18, 2014
INVENTOR(S) : Du et al.

Page 1 of 1

It is certified that error appears in the above-identified patent and that said Letters Patent is hereby corrected as shown below:

In the Claims

Column 11, line 6, Claim 18, after "duration", delete "greater".

Signed and Sealed this
Twenty-sixth Day of May, 2015

Michelle K. Lee
*Director of the United States Patent and Trademark Office*